United States Patent [19]

Boudewijns

[11] Patent Number: 4,893,090
[45] Date of Patent: Jan. 9, 1990

[54] AMPLIFIER ARRANGEMENT

[75] Inventor: Arnoldus J. J. Boudewijns, Eindhoven, Netherlands

[73] Assignee: U.S. Philips Corporation, New York, N.Y.

[21] Appl. No.: 241,689

[22] Filed: Sep. 7, 1988

[30] Foreign Application Priority Data

Sep. 14, 1987 [NL] Netherlands .................... 8702177

[51] Int. Cl.⁴ .............................................. H03F 3/45
[52] U.S. Cl. ...................................... 330/253; 330/257
[58] Field of Search ...................... 330/253, 257, 288; 323/315, 316

[56] References Cited

U.S. PATENT DOCUMENTS

| | | | |
|---|---|---|---|
| 4,447,782 | 10/1984 | Swanson | 330/288 |
| 4,471,292 | 9/1984 | Schenck et al. | 330/288 X |
| 4,550,284 | 10/1985 | Sooch | 330/288 X |
| 4,618,815 | 10/1986 | Swanson | 330/288 X |

Primary Examiner—James B. Mullins
Attorney, Agent, or Firm—Edward W. Goodman

[57] ABSTRACT

A signal voltage applied between the input terminals is converted by means of a differential amplifier into two phase-opposed signal currents which are inverted by means of a differential-to-single-ended converter into a single-ended signal current. The converter comprises a first and a second transistor with a common gate electrode and a third and a fourth transistor also with a common gate electrode, while the drain electrode of the third transistor is connected to the common date electrode of the first and the second transistor. The common gate electrode of the third and the fourth transistor is maintained at a voltage which is equal to the sum of one threshold voltage and two saturation voltages by means of a further transistor whose gate electrode is connected to the drain electrode and to a bias current source. The output of the amplifier can be driven by means of this converter up to two saturation voltages of the negative supply terminal.

13 Claims, 3 Drawing Sheets

AMPLIFIER ARRANGEMENT

BACKGROUND OF THE INVENTION

The invention relates to an amplifier arrangement comprising a differential amplifier having two input terminals for receiving an input voltage and a differential-to-single-ended converter having an output terminal for supplying an output current, said converter including a first and a second transistor of a first conductivity type whose source electrodes are coupled to a first supply terminal and whose gate electrodes are coupled together, and a third and a fourth transistor of the first conductivity type arranged in cascade with the first and the second transistor, respectively, and having their gate electrodes coupled together.

An amplifier arrangement of this type can be generally used as an operational amplifier having a relatively high gain and a relatively large bandwidth. Such an arrangement can be particularly used in video circuits, switched capacitor circuits and sample and hold circuits.

Such an amplifier arrangement is known from the book "Analysis and Design of Analog Integrated Circuits" P. R. Gray; R. G. Meyer, 1984 John Wiley and Sons Inc., page 753, FIG. 12.38.

In this known arrangement, the differential-to-single-ended converter is constituted by an improved Wilson current mirror in which the gate electrodes of both the first transistor and the third transistor are connected to the drain electrode.

This arrangement has the drawback that the output voltage swing of the amplifier arrangement is comparatively small. In fact, the drain electrode of the fourth transistor connected to the output can only be driven up to the sum of one threshold voltage and two saturation voltages with respect to the negative supply terminal.

SUMMARY OF THE INVENTION

It is therefore an object of the invention to provide an amplifier arrangement having a larger output voltage swing than the known arrangement. According to the invention an amplifier arrangement of a type described in the opening paragraph is characterized in that the gate electrode of the first transistor is coupled to the drain electrode of the third transistor and in that the arrangement also includes a bias circuit for biasing the gate electrodes of the third and the fourth transistor at a voltage which is substantially equal to the sum of one threshold voltage and two saturation voltages. In the arrangement according to the invention the output can be driven up to two saturation voltages with respect to the negative supply terminal. As compared with the known arrangement this results in an increase of the output voltage swing by one threshold voltage which is usually substantially 1 Volt. This leads to a considerable improvement of the output voltage swing, particularly at low supply voltages.

A first embodiment of an amplifier arrangement according to the invention may be characterized in that the differential amplifier includes a fifth and a sixth transistor of a second conductivity type opposite to the first conductivity type whose gate electrodes are coupled to the input terminals and whose source electrodes are coupled to a common terminal which is coupled by means of a second current source to a second supply terminal, and a seventh and an eighth transistor of a second conductivity type which are arranged in cascade with the fifth and the sixth transistors, respectively, and the; bias circuit includes a ninth transistor of the first conductivity type whose source electrode is coupled to the first supply terminal and whose gate electrode is coupled to the common gate electrode of the third and the fourth transistors and to its drain electrode which is coupled to a second supply terminal by means of a second current source. The gate-source voltage of the ninth transistor is biased by means of the second current source at a voltage which is equal to the sum of the threshold voltage and the saturation voltage of the fourth transistor and the saturation voltage of the second transistor so that the output can be driven up to at least two saturation voltages.

A second embodiment of an amplifier arrangement may be characterized in that a tenth transistor of the first conductivity type is arranged in series with the ninth transistor, the gate electrode of the ninth transistor being coupled to the gate electrode and to the drain electrode of the tenth transistor.

A third embodiment of an amplifier arrangement according to the invention may be characterized in that the gate electrodes of the seventh and the eighth transistors are coupled together and in that an eleventh transistor of the second conductivity type is arranged between the common terminal of the source electrodes of the fifth and the sixth transistors and the common gate electrode of the seventh and the eighth transistors, the drain electrode of said eleventh transistor being connected to its gate electrode and to the first supply terminal by means of a third current source. The common gate electrode of the seventh and the eighth transistors is biassed by means of the eleventh transistor at a substantially fixed voltage with respect to the common terminal of the source electrodes of the fifth and sixth transistors.

A further embodiment may be characterized in that a twelfth transistor of the first conductivity type is arranged in series with the eleventh transistor, said twelfth transistor having its source electrode coupled to the common gate electrode of the seventh and the eighth transistors and having its gate electrode coupled to the second supply terminal. Due to the twelfth transistor, the voltage difference between the common terminal of the source electrodes of the fifth and the sixth transistors and the common gate electrode of the seventh and the eighth transistors remain substantially constant over a large input d. c. voltage range.

A suitable further embodiment may be characterized in that the third current source is constituted by a thirteenth transistor of the first conductivity type whose source electrode is coupled to the first supply terminal and whose gate electrode is coupled to the gate electrode of the ninth transistor.

A fourth embodiment of an amplifier arrangement according to the invention may be characterized in that the arrangement is formed as an integrated circuit on a substrate of a first conductivity type in which the fifth and the sixth transistors are arranged in a zone of a second conductivity type which is connected to the second supply terminal and in which the seventh and the eighth transistors are arranged in separate zones of the second conductivity type which are connected to the drain electrodes of the fifth and the sixth transistors, respectively, and in that the gate electrodes of the seventh and the eighth transistors are connected to the gate electrodes of the fifth and the sixth transistors, respectively. In this embodiment, the so-called back-gate effect is used according to which the threshold voltage of a transistor increases as the bulk voltage increases. By connecting the zone in which the fifth and the sixth transistors are formed to a higher voltage than the zones in which the seventh and the eighth transistors are formed, the fifth and the sixth transistors acquire a higher threshold voltage than the seventh and the eighth transistors. This difference is so large that the gate electrodes of the seventh and the eighth transistors can be connected without any problem to the gate electrodes of the fifth and the sixth transistors.

A fifth embodiment of an amplifier arrangement according to the invention in which this back-gate effect is also used may be characterized in that the arrangement is formed as an integrated circuit on a substrate of a first conductivity type in which the fifth and the sixth transistors are arranged in a zone of a second conductivity type which is connected to the second supply terminal and in which the seventh and the eighth transistors are arranged in a common zone of the second conductivity type which is connected to the common terminal of the source electrodes of the fifth and the sixth transistors, and in that the gate electrode of the seventh and the eighth transistors are connected to the gate electrodes of the fifth and the sixth transistors, respectively.

A fifth embodiment in which this effect is also used may be characterized in that the arrangement is formed as an integrated circuit on a substrate of a first conductivity type in which the fifth and the sixth transistors are arranged in a zone of a second conductivity type which is connected to the second supply terminal and in which the seventh and the eight transistors are arranged in a common zone of the second conductivity type which is connected to the common terminal of the source electrodes of the fifth and the sixth transistors, and in that the gate electrode of the seventh transistor is connected to the gate electrode of the eighth transistor and to the gate electrode of the fifth transistor.

BRIEF DESCRIPTION OF THE DRAWINGS

The invention will now be described in greater detail by way of example with reference to the accompanying drawings, in which.

Corresponding components have the same reference numerals in these Figures.

DETAILED DESCRIPTION OF THE INVENTION

Figure 1:
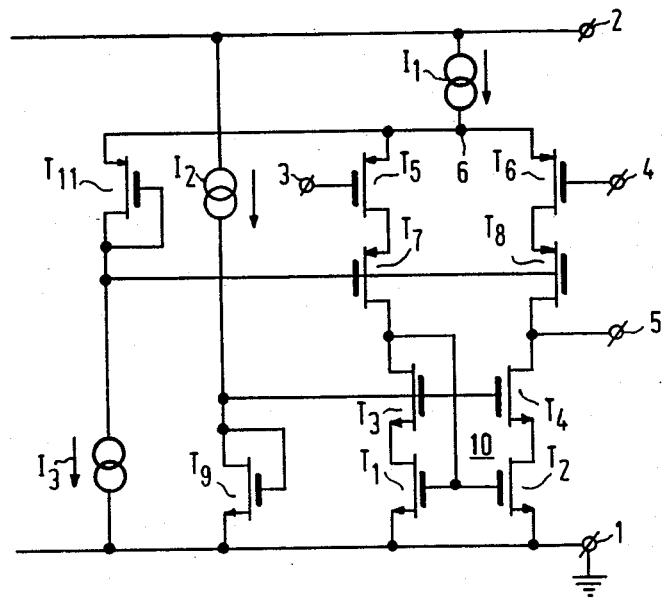
FIG. 1 shows a first embodiment of an amplifier arrangement according to the invention.

FIG. 1 shows a first embodiment of an amplifier arrangement according to the invention. It comprises two P-channel transistors $T_5$ and $T_6$ arranged as a differential pair whose common source terminal 6 is connected to the positive supply terminal 2 by means of a current source $I_1$. The gate electrodes of transistors $T_5$ and $T_6$ are connected to input terminals 3 and 4 for receiving an input voltage. Two P-channel transistors $T_7$ and $T_8$ are arranged in cascode with transistors $T_5$ and $T_6$ respectively. The transistors $T_7$ and $T_8$ have a common gate electrode which is maintained at a substantially fixed voltage with respect to the so-called common-mode voltage at the common source terminal 6 by means of a P-channel transistor $T_{11}$ whose drain electrode is connected to the gate electrode and to the negative supply terminal 1, in this embodiment ground, by means of a current source $I_3$.

A signal voltage applied between the input terminals 3 and 4 is converted by the differential amplifier $T_5$–$T_8$ into two phase-opposed signal currents which can in principle be taken from the drain electrodes of the transistors $T_7$ and $T_8$. As is known, the cascode transistors $T_7$ and $T_8$ increase the bandwidth of the amplifier arrangement because the Miller effect of the draingate capacitance of the transistors $T_5$ and $T_6$ is eliminated. Besides, the output impedance and hence the gain of the amplifier arrangement is increased thereby.

The drain electrode of transistor $T_7$ is coupled to both the drain electrode of transistor $T_8$ and to the output terminal 5 of the amplifier arrangement by means of a differential-to-single-ended converter 10 which converts the differential signal currents in the drain leads of transistors $T_7$ and $T_8$ into a single-ended output current at output terminal 5. The converter 10 has two N-channel transistors $T_1$ and $T_2$ whose source electrodes are connected to the supply terminal 1 and whose gate electrodes are connected together and to the drain electrode of transistor $T_7$. Two N-channel transistors $T_3$ and $T_4$ are arranged in cascade with transistors $T_1$ and $T_2$, respectively. The gate electrodes of these transistors are connected together and are biased at a fixed voltage with respect to ground by means of a bias circuit. This circuit is constituted by an N-channel transistor $T_9$ whose source electrode is connected to ground and whose gate electrode is connected to the drain electrode and to the common gate electrode of transistors $T_3$ and $T_4$. The drain electrode of transistor $T_9$ is connected to the positive supply terminal 2 by means of a current source $I_2$. The transistors $T_1$ and $T_2$ of the converter 10 constitute a current mirror which mirrors the current flowing through transistor $T_4$. The d.c. component therein compensates the d.c. component of the current through transistor $T_8$, while the phase-opposed signal currents result in an output signal current which is twice as large. Due to the cascode transistors $T_4$ and $T_8$ the amplifier arrangement acquires a high output impedance and hence a large gain. Moreover, the cascode transistors $T_4$ and $T_8$ eliminate the Miller effect of the drain-gate capacitance which is otherwise present between the output terminal 5 and the gate electrode of transistor $T_2$ and the gate electrode of transistor $T_6$, respectively. Consequently, the amplifier arrangement acquires a large bandwidth. The transistors $T_3$ and $T_7$ render the arrangement symmetrical and decrease the d.c. offset at the output.

The current intensity of the current source $I_2$ and the dimensions of transistor $T_9$ are chosen to be such that the gate-source voltage of transistor $T_9$ is substantially equal to the sum of the threshold voltage and the saturation voltage of transistor $T_4$ and the saturation voltage of transistor $T_2$. The saturation voltage is the minimum drain-source voltage which is required to bias a transistor in its saturation range. Since the gate-source voltage of transistor $T_4$ is equal to the sum of its threshold voltage and its saturation voltage, the voltage at the source electrode of transistor $T_4$ is then at least equal to the saturation voltage of transistor $T_2$ so that the voltage at the output terminal 5 can become at least equal to the sum of the saturation voltages of transistors $T_2$ and $T_4$. The output terminal 5 may therefore be driven up to two saturation voltages, that is to say, up to substantially 400 mV of the negative supply terminal 1 without a loss of gain. As compared with the known arrangement, this is an increase of the output voltage swing by one threshold voltage of approximately 1 V, which is a considerable improvement, particularly at low supply voltages.

Figure 2:
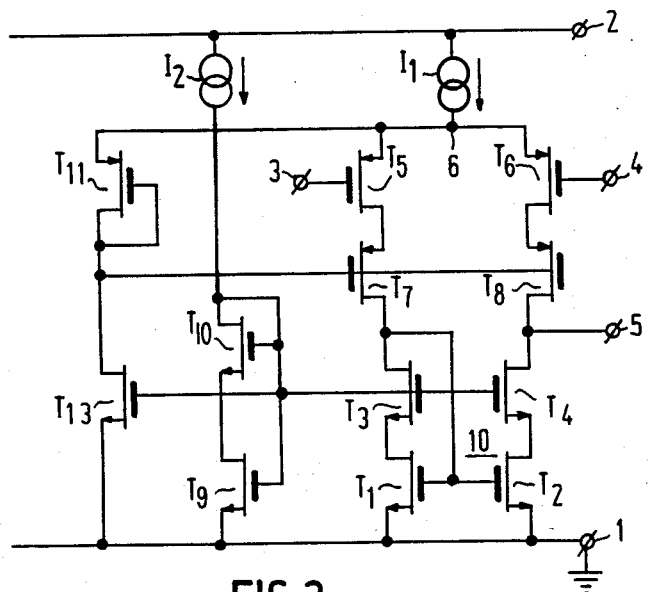
FIG. 2 shows a second embodiment of an amplifier arrangement according to the invention.

FIG. 2 shows a second embodiment of an amplifier arrangement according to the invention. The bias circuit for biasing the common gate electrode of transistors $T_3$ and $T_4$ now includes an N-channel transistor $T_{10}$ which is arranged in series with transistor $T_9$ and whose drain electrode is connected to its gate electrode and to the gate electrode of transistor $T_9$. In the arrangement of FIG. 1, transistor $T_9$ will be generally biased at a lower current than the transistors $T_2$ and $T_4$ in order to obtain a low dissipation. To realize the desired bias voltage, the channel length of transistor $T_9$ should be larger than that of transistors $T_2$ and $T_4$. The spread in the channel length of the transistors occurring due to process variations thereby influences the gate-source voltage of transistor $T_9$ and hence the bias voltage in a different way than the gate-source voltages of transistor $T_4$ and transistor $T_2$. By splitting transistor $T_9$ into two transistors $T_9$ and $T_{10}$ each having shorter channel lengths, the bias voltage variations occurring due to process variations are substantially equal to the variations of the voltages of the transistors $T_2$ and $T_4$ so that the minimum output voltage swing has become substantially independent of these process variations.

In this embodiment current source $I_3$ is formed advantageously by an N-channel transistor $T_{13}$ whose source is connected to ground terminal 1 and whose gate electrode is connected to the gate electrode of transistor $T_5$ which is at a fixed voltage with respect to ground.

Figure 3:
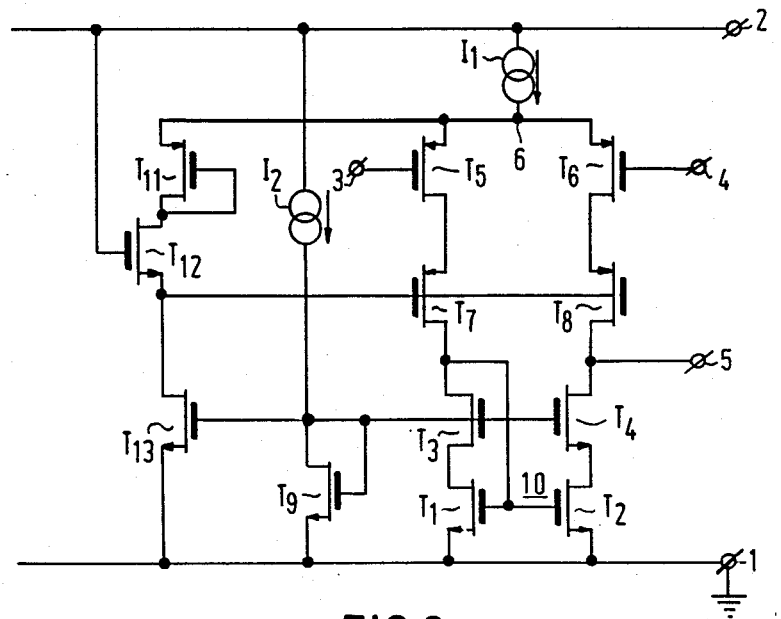
FIG. 3 shows a third embodiment of an amplifier arrangement according to the invention.

FIG. 3 shows a third embodiment of an amplifier arrangement according to the invention. In this embodiment the series arrangement of a P-channel transistor $T_{11}$ whose gate electrode is connected to the drain electrode and an N-channel transistor $T_{12}$ whose gate electrode is connected to the positive supply terminal 2 is arranged between the common source terminal 6 and the common gate electrode of the transistors $T_7$ and $T_8$. The common gate electrode of the transistor $T_7$ and $T_8$ is maintained by this arrangement at a fixed voltage with respect to the terminal 6 over a large input d.c. voltage range. In fact, the gate-source voltage variations of transistor $T_{11}$ occurring in the case of input d.c. voltage variations are compensated by oppositely occurring variations of the drain-source voltage of transistor $T_{12}$ so that the sum of these voltages remains substantially constant.

Figure 4:
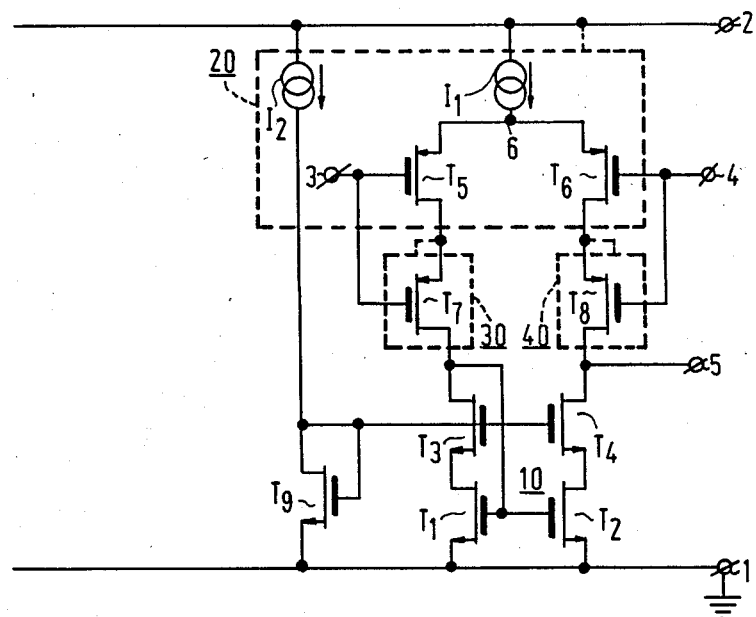
FIG. 4 shows a fourth embodiment of an amplifier arrangement according to the invention.

FIG. 4 shows a fourth embodiment of an amplifier arrangement according to the invention. In this embodiment it is not necessary to use a separate bias circuit to bias the common gate electrode of the transistors $T_7$ and $T_8$ at a substantially fixed voltage with respect to the terminal 6, but the gate electrodes of transistors $T_7$ and $T_8$ are connected to the gate electrodes of transistors $T_{15}$ and $T_6$, respectively. In this arrangement use is made of the so-called back-gate effect which causes the threshold voltage of a transistor to increase as the voltage between the source electrode and the bulk material in which the transistor is formed increases. In this embodiment the arrangement is integrated on a P-type substrate. The transistors $T_5$ and $T_6$ are formed in an N-well 20 which is connected to the positive supply terminal 2 and the transistors $T_7$ and $T_8$ are formed in N-wells 30 and 40 which are connected to the source electrode of the relevant transistor. Since the source-bulk voltage of transistors $T_5$ and $T_6$ is high and that of transistors $T_7$ and $T_8$ is zero, the threshold voltage of transistors $T_5$ and $T_6$ is larger than that of transistors $T_7$ and $T_8$. The difference between these threshold voltages is present between the source and drain electrodes of transistors $T_5$ and $T_6$. Although the source-bulk voltage of transistors $T_5$ and $T_6$ is dependent on the input d.c. voltage, this voltage difference is sufficiently large over a relatively large range to drive transistors $T_5$ and $T_6$ into saturation so that these transistors can convey a sufficiently large current. The threshold voltage of transistors $T_5$ and $T_6$ is, for example substantially equal to 1.4 V over a relatively large range, while the threshold voltage of transistors $T_7$ and $T_8$ is equal to 1.0 Volt.

Figure 5:
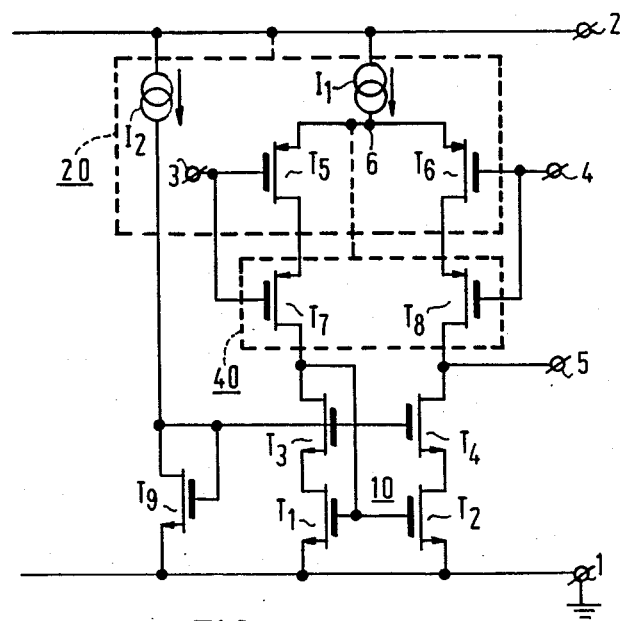
FIG. 5 shows a fifth embodiment of an amplifier arrangement according to the invention.

FIG. 5 shows a fifth embodiment of an amplifier arrangement according to the invention. In this embodiment the transistors $T_7$ and $T_8$ are not arranged in separate N-wells but in one common N-well 40 which is connected to the common source terminal 6. The gate electrodes of transistors $T_7$ and $T_8$ are again connected to the gate electrodes of transistors $T_5$ and $T_6$. In this embodiment both the source-bulk voltage of the transistors $T_5$ and $T_6$ and the source-bulk voltage of the transistors $T_7$ and $T_8$ is dependent on the input d.c. voltage. The source-bulk voltage of transistors $T_5$ and $T_6$ is then larger than the source-bulk voltage of the transistors $T_7$ and $T_8$ so that the threshold voltage of transistors $T_5$ and $T_6$ is always larger than that of transistors $T_7$ and $T_8$. The difference between these voltages is present between the source and drain electrodes of transistors $T_5$ and $T_6$ and is larger than the saturation voltage of these transistors over a relatively reasonably large range of the input d.c. voltage so that these transistors can convey a relatively large current. The arrangement of FIG. 5 is built up very symmetrically. This arrangement is very suitable for use as a buffer amplifier.

Figure 6:
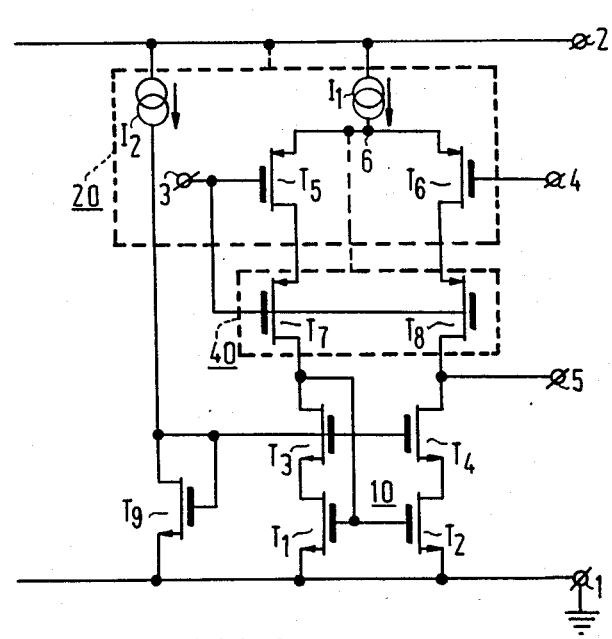
FIG. 6 shows a sixth embodiment of an amplifier arrangement according to the invention.

FIG. 6 shows a sixth embodiment of an amplifier arrangement according to the invention. In this embodiment the transistors $T_7$ and $T_8$ are arranged in a common N-well 40 which is connected to the common terminal 6 of the source electrodes of the transistors $T_5$ and $T_6$. The gate electrodes of the transistors $T_7$ and $T_8$ are interconnected and are connected to the gate electrode of input transistor $T_5$. This arrangement substantially has the same properties as the arrangement of FIG. 5, but it is built up less symmetrically. The amplifier arrangement of FIG. 6 is particularly suitable for use in an inverting amplifier in which a first capacitor is connected to the input 4 and a second capacitor is arranged between the input 4 and the output 5. If the arrangement of FIG. 5 is used in such an amplifier, the drain-gate capacitance of transistor $T_8$ influences the gain. When using the arrangement of FIG. 6 in such an amplifier, this effect does not occur and the gain is only determined by the first and the second capacitor.

The invention is not limited to the embodiments shown and many variations within the scope of the invention are possible to those skilled in the art. The bias circuit for biasing the common gate electrode of the transistors $T_3$ and $T_4$ may be formed in any other way than in the manners shown, provided that this voltage is at least equal to the sum of one threshold voltages and two saturation voltages. The differential amplifier may also be built up in any other way than in the manner shown. In the embodiments of FIGS. 5 and 6, the common N-well of the transistors $T_7$ and $T_8$ may in principle also be connected to the source electrode of transistor $T_7$. Finally, the amplifier arrangement may of course also be formed with transistors of the opposite conductivity type.

What is claimed is:

1. An amplifier arrangement comprising a differential amplifier having two input terminals for receiving an input voltage and a differential-to-single-ended converter having an output terminal for supplying an output current, said converter including a first and a second transistor of a first conductivity type whose source electrodes are coupled to a first supply terminal and whose gate electrodes are coupled together, and a third and a fourth transistor of the first conductivity type arranged in cascade with the first and the second transistors, respectively, and having their gate electrodes coupled together, the gate electrode of the first transistor being coupled to a drain electrode of the third transistor, said differential amplifier including a fifth and a sixth transistor of a second conductivity type opposite to the first conductivity type whose gate electrodes are coupled to the input terminals and whose source electrodes are coupled to a common terminal which is coupled by means of a first constant current source to a second supply terminal, and a seventh and an eighth transistor of the second conductivity type which are arranged in cascade with the fifth and the sixth transistors respectively, the arrangement also including a bias circuit for biasing the gate electrodes of the third and the fourth transistors at a voltage which is substantially equal to the sum of one threshold voltage and two saturation voltages, said bias circuit including a ninth transistor of the first conductivity type whose source electrode is coupled to the first supply terminal and whose gate electrode is coupled to the gate electrodes of the third of the fourth transistors and to its drain electrode, characterized in that the drain electrode of the ninth transistor is coupled to the second supply terminal by means of a second constant current source.

2. An amplifier arrangement as claimed in claim 1 characterized in that a tenth transistor of the first conductivity type is arranged in series with the ninth transistor, the gate electrode of the ninth transistor being coupled to the gate electrode and to the drain electrode of the tenth transistor.

3. An amplifier arrangement as claimed in claim 2 characterized in that the gate electrodes of the seventh and the eighth transistors are coupled together and in that an eleventh transistor of the second conductivity type is arranged between the common terminal of the source electrodes of the fifth and the sixth transistors and the coupled together gate electrodes of the seventh and the eight transistors, the drain electrode of said eleventh transistor being connected to its gate electrode and said drain electrode being connected to the first supply terminal by means of a third constant current source.

4. An amplifier arrangement as claimed in claim 3 characterized in that a twelfth transistor of the first conductivity type is arranged in series with the eleventh transistor, said twelfth transistor having its source electrode coupled to the coupled together gate electrodes of the seventh and the eighth transistors and having its gate electrode coupled to the second supply terminal.

5. An amplifier arrangement as claimed in claim 4 characterized in that the third constant current source is constituted by a thirteenth transistor of the first conductivity type whose source electrode is coupled to the first supply terminal and whose gate electrode is coupled to the gate electrode of the ninth transistor.

6. An amplifier arrangement as claimed in claim 3, characterized in that the third constant current source is constituted by a twelfth transistor of the first conductivity type whose source electrode is coupled to the first supply terminal and whose gate electrode is coupled to the gate electrode of the ninth transistor.

7. An amplifier arrangement as claimed in claim 1 or 2 characterized in that the arrangement is formed as an integrated circuit on a substrate of a first conductivity type in which the fifth and the sixth transistors are arranged in a zone of a second conductivity type which is connected to the second supply terminal and in which the seventh and the eighth transistors are arranged in separate zones of the second conductivity type which are connected to the drain electrodes of the fifth and the sixth transistors, respectively, and in that the gate electrodes of the seventh and the eighth transistors are connected to the gate electrodes of the fifth and the sixth transistors, respectively.

8. An amplifier arrangement as claimed in claim 1 or 2 characterized in that the arrangement is formed as an integrated circuit on a substrate of a first conductivity type in which the fifth and the sixth transistors are arranged in a zone of the second conductivity type which is connected to the second supply terminal and in which the seventh and the eighth transistors are arranged in a common zone of the second conductivity type which is connected to the common terminal of the source electrodes of the fifth and the sixth transistors, and in that the gate electrodes of the seventh and the eighth transistors are connected to the gate electrode of the fifth and the sixth transistors, respectively.

9. An amplifier arrangement as claimed in claim 1 or 2, characterized in that the arrangement is formed as an integrated circuit on a substrate of a first conductivity type in which the fifth and the sixth transistors are arranged in a zone of a second conductivity type which is connected to the second supply terminal and in which the seventh and the eighth transistors are arranged in a common zone of the second conductivity type which is connected to the common terminal of the source electrodes of the fifth and the sixth transistors, and in that the gate electrode of the seventh transistor is connected to the gate electrode of the eighth transistor and to the gate electrode of the fifth transistor.

10. An amplifier arrangement as claimed in claim 1 characterized in that the gate electrodes of the seventh and the eighth transistors are coupled together and in that a tenth transistor of the second conductivity type is arranged between the common terminal of the source electrodes of the fifth and the sixth transistors and the coupled together gate electrodes of the seventh and the eighth transistors, the drain electrode of said tenth transistor being connected to its gate electrode and said drain electrode being connected to the first supply terminal by means of a third constant current source.

11. An amplifier arrangement as claimed in claim 10 characterized in that an eleventh transistor of the first conductivity type is arranged in series with the tenth transistor, said eleventh transistor having its source electrode coupled to the coupled together gate electrodes of the seventh and the eighth transistors and having its gate electrode coupled to the second supply terminal.

12. An amplifier arrangement as claimed in claim 11 characterized in that the third constant current source is constituted by a twelfth transistor of the first conductivity type whose source electrode is coupled to the first supply terminal and whose gate electrode is coupled to the gate electrode of the ninth transistor.

13. An amplifier arrangement as claimed in claim 10 characterized in that the third current source is constituted by an eleventh transistor of the first conductivity type whose source electrode is coupled to the first supply terminal and whose gate electrode is coupled to the gate electrode of the ninth transistor.

* * * * *